(12) United States Patent
Seon

(10) Patent No.: US 9,194,891 B2
(45) Date of Patent: Nov. 24, 2015

(54) ROOT MEAN SQUARE DETECTOR AND CIRCUIT BREAKER USING THE SAME

(71) Applicant: LSIS CO., LTD., Anyang-si, Gyeonggi-do (KR)

(72) Inventor: Jong Kug Seon, Seoul (KR)

(73) Assignee: LSIS Co., Ltd., Anyang-Si, Gyeonggi-Do (KR)

(*) Notice: Subject to any disclaimer, the term of this patent is extended or adjusted under 35 U.S.C. 154(b) by 0 days.

(21) Appl. No.: 14/167,874

(22) Filed: Jan. 29, 2014

(65) Prior Publication Data
US 2014/0233144 A1    Aug. 21, 2014

(30) Foreign Application Priority Data

Feb. 18, 2013    (KR) .......................... 10-2013-0017173

(51) Int. Cl.
| | | |
|---|---|---|
| *H02H 3/00* | (2006.01) | |
| *G01R 19/02* | (2006.01) | |
| *G01R 19/03* | (2006.01) | |
| *G06G 7/20* | (2006.01) | |
| *G01R 21/06* | (2006.01) | |
| *G01R 19/165* | (2006.01) | |

(52) U.S. Cl.
CPC ................ *G01R 19/02* (2013.01); *G01R 19/03* (2013.01); *G01R 19/16547* (2013.01); *G01R 21/06* (2013.01); *G06G 7/20* (2013.01)

(58) Field of Classification Search
USPC ........................................ 361/86–87, 115, 42
See application file for complete search history.

(56) References Cited

U.S. PATENT DOCUMENTS

| | | | | |
|---|---|---|---|---|
| 4,885,656 A | * | 12/1989 | Suzuki et al. | ................... 361/86 |
| 4,947,109 A | * | 8/1990 | Suzuki | ........................ 324/132 |
| 5,644,238 A | * | 7/1997 | Seifert et al. | .................. 324/424 |
| 8,823,356 B2 | * | 9/2014 | Chapman | ................... 324/76.11 |

FOREIGN PATENT DOCUMENTS

| | | |
|---|---|---|
| JP | 60-244866 | 12/1985 |
| JP | 63-024377 | 2/1988 |
| JP | 05-061994 | 3/1993 |
| JP | 05-128960 | 5/1993 |
| JP | 08-106504 | 4/1996 |
| JP | 10-229311 | 8/1998 |
| JP | 11-250168 | 9/1999 |
| JP | 2007-264149 | 10/2007 |
| JP | 2010-114710 | 5/2010 |

OTHER PUBLICATIONS

Japan Patent Office Application Serial No. 2014-026466, Office Action dated Jan. 20, 2015, 3 pages.

* cited by examiner

*Primary Examiner* — Danny Nguyen
(74) *Attorney, Agent, or Firm* — Lee, Hong, Degerman, Kang & Waimey

(57) ABSTRACT

The present disclosure relates to a RMS detector for directly computing a signal detected through an analog circuit to measure its RMS value, and a circuit breaker using the same. For this purpose, a RMS detector according to the present disclosure may include a plurality of voltage/current sensing units configured to detect a voltage or current shaped analog signal for an arbitrary load; a plurality of square circuit units configured to compute square function units, respectively, based on a voltage output from the plurality of voltage/current sensing units; a summing circuit unit configured to sum a plurality of output voltages output from the plurality of square circuit units, respectively; and a root circuit unit configured to compute a RMS value based on a voltage output from the summing circuit unit.

9 Claims, 3 Drawing Sheets

ROOT MEAN SQUARE DETECTOR AND CIRCUIT BREAKER USING THE SAME

CROSS-REFERENCE TO RELATED APPLICATIONS

Pursuant to 35 U.S.C. §119(a), this application claims the benefit of earlier filing date and right of priority to Korean Patent Application No. 10-2013-0017173, filed on Feb. 18, 2013, the contents of which is incorporated by reference herein in its entirety.

BACKGROUND OF THE INVENTION

1. Field of the Invention

The present disclosure relates to a Root Mean Square (abbreviated as RMS hereinafter) detector and a circuit breaker using the same, and more particularly, to a RMS detector for directly computing a signal detected through an analog circuit to measure its RMS value, and a circuit breaker using the same.

2. Description of the Related Art

In general, RMS detectors are applied to technologies for calculating and detecting an electric power or the like in a system for detecting the usage of electricity, gas and water and measuring the electric power of a relay or the like, and technologies for performing a root mean square calculation on a current or voltage in a system having a circuit breaker with unnecessary noise to prevent its malfunction, and the like.

The RMS detector may include a voltage/current signal detector for detecting a current, a voltage or the like, an analog-digital converter for converting an analog signal to a digital signal, a microcontroller or signal processor for computing and processing the converted digital information and controlling the entire system, and a data collector or memory for storing the collected data.

PRIOR ART INFORMATION

Patent Document 1: Korean Patent Registration No. 10-0705548

SUMMARY OF THE INVENTION

An aspect of the present disclosure is to provide a RMS detector for directly computing a signal detected through an analog circuit to measure its RMS value, and a circuit breaker using the same.

Another aspect of the present disclosure is to provide a RMS detector for directly computing a signal detected by an analog circuit in which the entire system is integrated through a Complementary Metal Oxide Semiconductor (abbreviated as CMOS hereinafter) process to measure its RMS value, and a circuit breaker using the same.

Still another aspect of the present disclosure is to provide a RMS detector for measuring a RMS value applicable to application areas such as a circuit breaker that requires high-speed RMS values or the like, and a circuit breaker using the same.

Yet still another aspect of the present disclosure is to provide a RMS detector for preventing a circuit breaker from being malfunctioned due to noise even when noise is contained in the detected voltage or current, and a circuit breaker suing the same.

An aspect of the present disclosure as described above may be accomplished by providing a RMS detector, comprising:

a plurality of voltage/current sensing units configured to detect a voltage or current shaped analog signal of an arbitrary electric load, and convert the detected current shaped analog signal into a voltage shaped analog signal upon detecting the current shaped analog signal;

a plurality of square circuit units configured to compute square function, respectively, based on a voltage output from the plurality of voltage/current sensing units;

a summing circuit unit configured to sum a plurality of output voltages output from the plurality of square circuit units, respectively; and a root circuit unit configured to compute a RMS value based on a voltage output from the summing circuit unit.

Another aspect of the present disclosure as described above may be accomplished by configuring a RMS detector wherein the RMS detector including the plurality of voltage/current sensing units, the plurality of square circuit units, the summing circuit unit and the root circuit unit is fabricated as an analog circuit that is integrated through the CMOS process, and a signal detected by the relevant fabricated analog circuit is directly computed to measure a RMS value.

Furthermore, another aspect of the present disclosure as described above may be accomplished by providing a circuit breaker, including:

a voltage/current sensing unit configured to detect a voltage or current shaped analog signal of an arbitrary electric load;

the RMS detector configured to compute a RMS value based on an output voltage of the voltage/current sensing unit; and a comparator configured to compare the RMS value computed from the RMS detector with a preset reference voltage to control the switching operation of the circuit breaker.

Still another aspect of the present disclosure as described above may be accomplished by providing a RMS detector for computing the RMS value, which is configured with an analog circuit including the foregoing plurality of voltage/current sensing units, the plurality of square circuit units, the summing circuit unit and the root circuit unit, not to perform computation and processing processes such as digital signal processing using a microprocessor and process program, thereby applying the RMS detector to application areas such as a circuit breaker that requires high speed RMS values or the like to enhance the breaking speed.

Yet still another aspect of the present disclosure as described above may be accomplished by preventing a circuit breaker from being malfunctioned since it has a configuration using a RMS detector for performing a root mean square calculation on the detected current or voltage value, and additionally, a circuit breaker according to the present disclosure has a configuration in which an output value of the RMS detector is compared with a preset reference value by a comparator for a resultant output so that the circuit breaker may not output a trip control signal responding to any noise having higher voltage than the preset reference value.

According to an aspect of the present disclosure, the square circuit unit comprises:

a square function unit that computes the square function;
a root function unit that computes a root function; and
a differential circuit section configured to subtract an output current of the root function unit from an output current of the square function unit.

According to another aspect of the present disclosure, the square function unit comprises:

a first current source having one end of which is connected to a current supply unit, and the other end of which is connected to a source of a first transistor;

a second current source having one end of which is connected to the current supply unit, and the other end of which is connected to a source of a second transistor;

the first transistor having a source of which is connected to the first current source, and a gate of which is connected to a voltage output terminal of the voltage/current sensing unit, and a drain of which is connected to an output current source;

the second transistor having a source of which is connected to the second current source, and a gate of which is connected to the voltage output terminal of the voltage/current sensing unit, and a drain of which is connected to the output current source; and the output current source having one end of which is connected to a drain of the first transistor and a drain of the second transistor, respectively, the other end of which is connected to a ground.

According to still another aspect of the present disclosure, the root function unit comprises:

a first current source having one end of which is connected to a current supply unit, and the other end of which is connected to a source of a third transistor, a gate of a fourth transistor and a gate of a fifth transistor;

a second current source having one end of which is connected to a gate of the third transistor and a drain of the fourth transistor, and the other end of which is connected to a ground;

a third current source having one end of which is connected to the current supply unit, and the other end of which is connected to a source of the fifth transistor;

the third transistor having a source of which is connected to the first current source, a gate of the fourth transistor and a gate of the fifth transistor, a gate of which is connected to the second current source and a drain of the fourth transistor, and a drain of which is connected to the ground;

the fourth transistor having a source of which is connected to the current supply unit, a gate of which is connected to the first current source and a source of the third transistor and a gate of the fifth transistor, and a drain of which is connected to a gate of the third transistor and the second current source;

the fifth transistor having a source of which is connected to the third current source, a gate of which is connected to the first current source, a source of the third transistor and a gate of the fourth transistor, and a drain of which is connected to a source and a gate of a sixth transistor; and the six transistor having a source and a gate of which are connected to a drain of the fifth transistor, and a drain of which is connected to the ground.

According to yet still another aspect of the present disclosure, the root circuit unit is configured to compute the RMS value by the following equation based on a voltage output from the summing circuit unit, $$\sqrt{I_c(KV_{in1}^2 + KV_{in2}^2 + KV_{in3}^2 + ... + KV_{inN}^2)}$$

wherein the $I_c$ is a constant current value supplied from a current supply unit, the K is a trans conductance parameter, the $V_{in1}^2$ through the $V_{inN}^2$ are voltages output from the plurality of voltage/current sensing unit.

According to still yet another aspect of the present disclosure, a circuit breaker to which the RMS detector is applied comprises: a voltage/current sensing unit configured to detect a voltage or current shaped analog signal for an arbitrary electric load;

the RMS detector configured to compute a RMS value based on an output voltage of the voltage/current sensing unit; and a comparator configured to compare the RMS value computed and output from the RMS detector with a preset reference voltage to control a switching operation of the circuit breaker.

According to yet still another aspect of the present disclosure, the RMS detector is configured to suppress noise contained in an output voltage of the voltage/current sensing unit.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
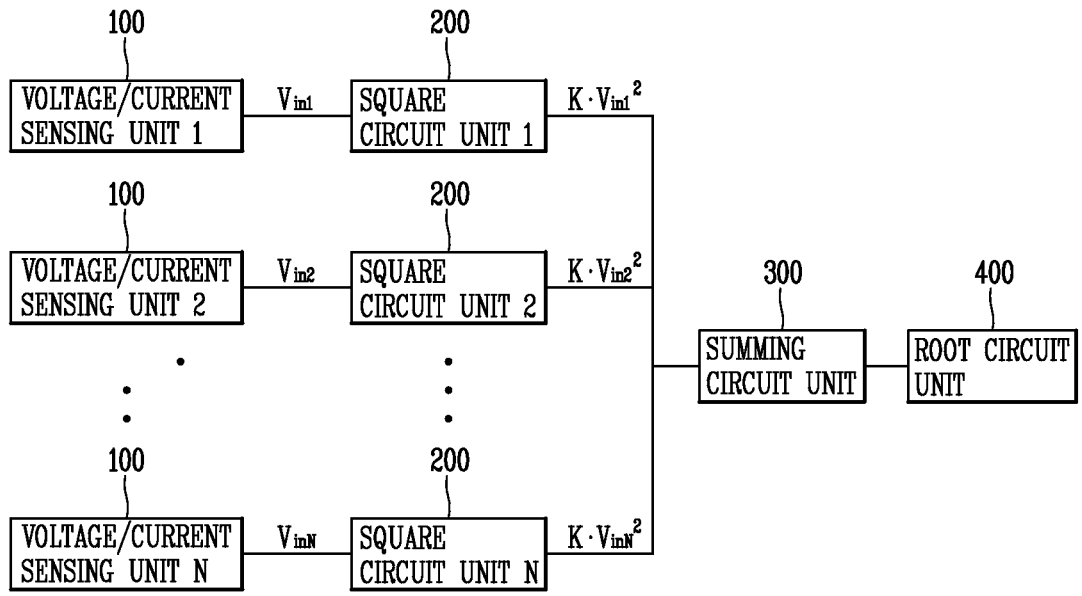
FIG. 1 is a view illustrating the configuration of a RMS detector according to an embodiment of the present disclosure.

Hereinafter, preferred embodiments of the present invention will be described in detail with reference to the accompanying drawings, and the same or similar elements are designated with the same numeral references regardless of the numerals in the drawings and their redundant description will be omitted.

FIG. 1 is a view illustrating the configuration of a RMS detector 10 according to an embodiment of the present disclosure.

As illustrated in FIG. 1, the RMS detector 10 may include a plurality of voltage/current sensing units 100, a plurality of square circuit units 200, a summing circuit unit 300, and a root circuit unit 400. However, all the constituent elements of the RMS detector 10 as illustrated in FIG. 1 are not necessarily required, and the RMS detector 10 may be implemented with a greater or less number of elements than that of those illustrated elements.

The voltage/current sensing unit 100 detects a voltage shaped or current shaped analog signal of an arbitrary electric load. Here, the arbitrary electric load may be a digital power meter, a digital gas meter, a digital water meter, a digital relay, an electric power meter, and the like.

Furthermore, upon detecting a current shaped analog signal, the voltage/current sensing unit 100 converts the detected current shaped analog signal into a voltage shaped analog signal.

Furthermore, the voltage/current sensing unit 100 transfers (in other words outputs) a voltage (for example, $V_{in1}$, $V_{in2}$, ..., $V_{inN}$) detected from the arbitrary electric load to the square circuit unit 200 as illustrated in FIG. 1.

The square circuit unit 200 computes a square function based on a voltage output from the voltage/current sensing unit 100.

Figure 2:
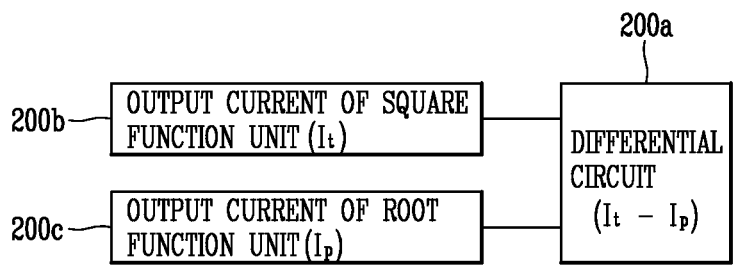
FIG. 2 is a block diagram illustrating the configuration of a square circuit unit according to an embodiment of the present disclosure.

In other words, the square circuit unit 200 configures a differential circuit based on a differential voltage ($V_{in+}-V_{in-}$) which is an analog signal output from the voltage/current sensing unit 100 to compute the square function. Furthermore, as illustrated in FIG. 2, the square circuit unit 200 can comprise a square function unit 200b that computes the square function, a root function unit 200c that computes a root function, and a differential circuit 200a for subtracting an output current ($I_p$) of the root function unit 200c from an output current ($I_t$) of the square function unit 200b.

Here, the square function unit 200b may include a first current source $I_1$, a second current source $I_2$, an output current source $I_t$, and a plurality of transistors (for example, including $M_1$ and $M_2$). Here, the voltages $V_{in+}$ and the $V_{in-}$ are analog signals output from the voltage/current sensing unit 100.

Here, one end of the first current source is connected to a current supplying unit (not shown), and the other end thereof is connected to a source of the first transistor ($M_1$). Furthermore, one end of the second current source $I_2$ is connected to the current supplying unit (not shown), and the other end thereof is connected to a source of the second transistor ($M_2$). Furthermore, the source of the first transistor ($M_1$) is connected to the first current source $I_1$, and the gate thereof is connected to a voltage output terminal of the voltage/current sensing unit 100 from which output voltage $V_{in+}$ is output, and the drain thereof is connected to the output current source $I_t$.

Furthermore, the source of the second transistor ($M_2$) is connected to the second current source $I_2$, and the gate thereof is connected to the voltage output terminal of the voltage/current sensing unit 100 from which output voltage $V_{in+}$ is output, and the drain thereof is connected to the output current source $I_t$.

One end of the output current source $I_t$ is connected to a drain of the first transistor ($M_1$) and a drain of the second transistor ($M_2$), respectively, and the other end thereof is connected to the ground.

Figure 3:
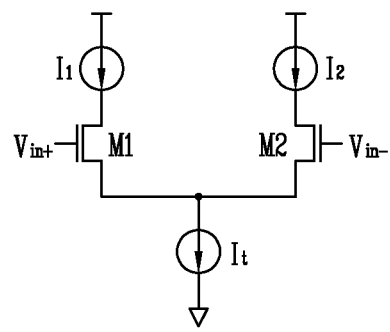
FIG. 3 is a circuit diagram illustrating the configuration of a square function unit contained in the square circuit unit according to an embodiment of the present disclosure.
Figure 4:
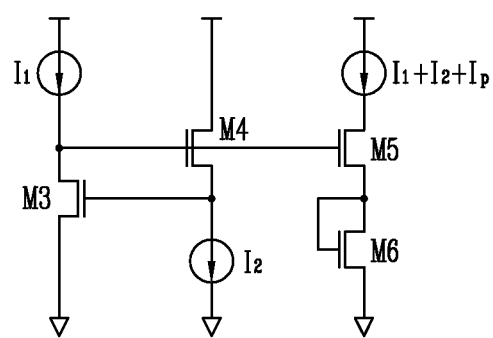
FIG. 4 is a circuit diagram illustrating the configuration of a root function unit contained in the square circuit unit according to an embodiment of the present disclosure.

Furthermore, as illustrated in FIG. 4, the root function unit may include a first current source a second current source $I_2$, a third current source $I_1+I_2+I_p$, and a plurality of transistors (for example, $M_3$, $M_4$, $M_5$ and $M_6$). Here, the first current source and a second current source $I_2$ in FIG. 4 are not the same as the first current source $I_1$ and the second current source $I_2$ in FIG. 3.

Here, one end of the first current source $I_1$ is connected to a current supplying unit (not shown), and the other end thereof is connected to a source of the third transistor ($M_3$), a gate of the fourth transistor ($M_4$) and a gate of the fifth transistor ($M_5$).

Furthermore, one end of the second current source $I_2$ is connected to a gate of the third transistor ($M_3$) and a drain of the fourth transistor ($M_4$), and the other end thereof is connected to the ground.

Furthermore, one end of the third current source $I_1+I_2+I_p$ is connected to a current supplying unit (not shown), and the other end thereof is connected to a source of the fifth transistor ($M_5$). Furthermore, the source of the third transistor ($M_3$) is connected to the first current source $I_1$, a gate of the fourth transistor ($M_4$) and a gate of the fifth transistor ($M_5$), and the gate thereof is connected to the second current source $I_2$ and a drain of the fourth transistor ($M_4$), and the drain thereof is connected to the ground.

The source of the fourth transistor ($M_4$) is the current supplying unit, and the gate thereof is connected to the first current source $I_1$, a source of the third transistor ($M_3$) and a gate of the fifth transistor ($M_5$), and the drain thereof is connected to a gate of the third transistor ($M_3$) and the second current source $I_2$. Furthermore, the source of the fifth transistor ($M_5$) is the third current source $I_1+I_2+I_p$, and the gate thereof is connected to the first current source $I_1$, a source of the third transistor ($M_3$) and a gate of the fourth transistor ($M_4$), and the drain thereof is connected to a source and a gate of the sixth transistor ($M_6$). Furthermore, the source and gate of the sixth transistor ($M_6$) are connected to a drain of the fifth transistor ($M_5$), and the drain thereof is connected to the ground.

Furthermore, the output current source $I_t$ illustrated in FIG. 3 may be expressed as the following Equation 1 when applying a typical CMOS process among analog circuit design methods.

$$I_t = I_1 + I_2 = 2\sqrt{I_1 I_2} K \cdot V_{in}^2 \qquad \text{[Equation 1]}$$

Here, the trans conductance parameter "K" as a process parameter is expressed as follows.

$$K = \frac{C_{ox} \cdot \mu \cdot W}{2L}$$

Here, the "$C_{ox}$" is a capacitor value on the gate oxide layer, and the "$\mu$" is mobility, and the "W" is a width of the transistor, and the "L" is a length of the transistor.

Furthermore, the Equation 1 is configured with two functions having a square function term and a root function term.

Furthermore, the "$I_p$" illustrated in FIG. 4 is implemented by a root function unit as illustrated in FIG. 4.

In other words, when the current $I_3$ flowing through the third transistor ($M_3$) is equal to the current $I_1$, and the current $I_4$ flowing through the fourth transistor ($M_4$) is equal to the current $I_2$, a gate-to-source voltage of the third transistor ($M_3$), fourth transistor ($M_4$), fifth transistor ($M_5$) and sixth transistor ($M_6$) is expressed as the following Equation 2 based on a loop equation.

$$V_{gs3} + V_{gs4} = V_{gs5} + V_{gs6} \qquad \text{[Equation 2]}$$

Furthermore, when a basic current equation for CMOS, $I = K(V_{gs} - V_{th})^2$, is applied and a size ratio of the transistor is $(W/L)_{3,4} = 4(W/L)_{5,6}$, a relation between the currents $I_1$, $I_2$ and $I_1+I_2+I_p$ illustrated in FIG. 4 is expressed as the following Equation 3.

$$\sqrt{I_1} + \sqrt{I_2} = \sqrt{I_1 + I_2 + I_p} \qquad \text{[Equation 3]}$$

Hence, the current $I_p$ of the root function unit is expressed as the following Equation 4.

$$I_p = 2\sqrt{I_1 I_2} \qquad \text{[Equation 4]}$$

Hence, for the square circuit unit 200, when the Equation 4 expressed as $I_p$ in FIG. 4 is subtracted from the Equation 1 expressed as $I_t$ in FIG. 3, the square function unit expressed as the following Equation 5 is obtained.

$$I_t - I_p = K \cdot V_{in}^2 \qquad \text{[Equation 5]}$$

In this manner, the square circuit unit 200 has a configuration as illustrated in FIG. 2, and the output of the square circuit unit 200 has a square function characteristic.

The summing circuit (in other words "adder circuit") 300 sums (in other words "adds") a plurality of output voltages output from the plurality of square circuit units 200, respectively.

In other words, the summing circuit unit 300 sums output voltages in the form of square function units, respectively, output from the plurality of square circuit units 200.

For an example, the summing circuit unit 300 sums output voltages (for example, $K \cdot V_{in1}^2$, $K \cdot V_{in2}^2$, $K \cdot V_{in3}^2$, ..., $K \cdot V_{inN}^2$) in the form of square functions, respectively, output from the plurality of square circuit units 200 as illustrated in FIG. 1 to output the summed voltage expressed as the following Equation 6.

$$KV_{in1}^2 + KV_{in2}^2 + KV_{in3}^2 + \ldots + KV_{inN}^2 \qquad \text{[Equation 6]}$$

The root circuit unit (in other words "RMS computing unit") 400 computes a RMS value based on a voltage output from the summing circuit unit 300.

In other words, when the current from the current sources I1 and I2 illustrated in FIG. 4 are constant currents Ic, the root circuit unit 400 computes and outputs the RMS value expressed as the following Equation 7 based on a voltage output from the summing circuit unit 300.

$$\sqrt{I_c(KV_{in1}^2 + KV_{in2}^2 + KV_{in3}^2 + \ldots + KV_{inN}^2)} \qquad \text{[Equation 7]}$$

As described above, the RMS detector 10 may be configured with an analog circuit including the plurality of voltage/current sensing units 100, the plurality of square circuit units 200, the summing circuit unit 300 and the root circuit unit 400, and thus directly compute a signal detected through the relevant analog circuit without processes such as digital conversion and computing processing of the central processing unit to measure the RMS value.

Furthermore, as described above, the RMS detector 10 may configure the entire configuration with an analog integrated circuit through a CMOS process, and thus directly compute a signal detected by the relevant analog integrated circuit to measure the RMS value.

Furthermore, as described above, the RMS detector 10 may measure RMS values at high speed by an analog circuit, and thus may be applicable to application areas such as a circuit breaker that requires high-speed RMS values or the like.

Furthermore, in order to calculate the RMS value, it may be possible to implement the measurement value calculation function through the configuration of such a simple analog circuit, compared to a configuration with high cost elements, such as microprocessor, memory and the like, that requires a long computational processing time.

Figure 5:
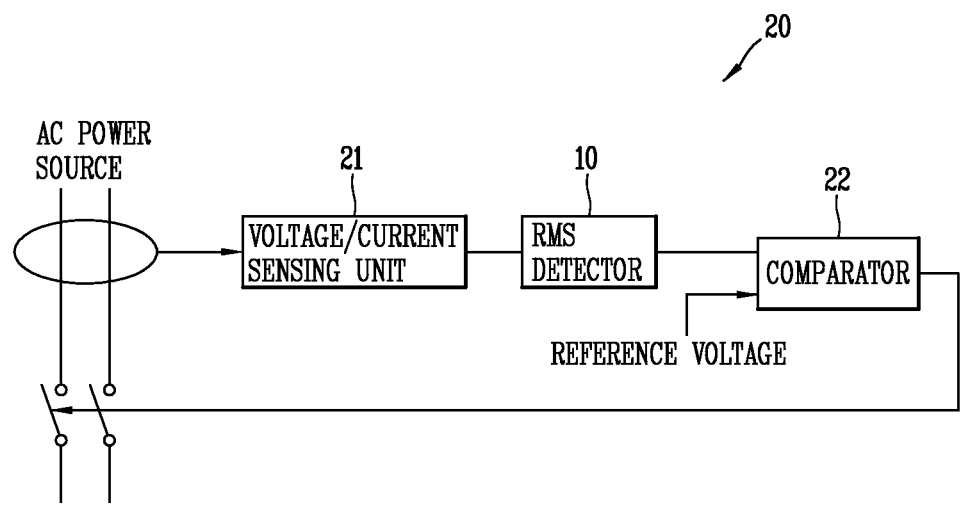
FIG. 5 is a block diagram illustrating the configuration of a circuit breaker to which the RMS detector is applied according to an embodiment of the present disclosure.

FIG. 5 is a block diagram illustrating the configuration of a circuit breaker 20 to which the RMS detector 10 is applied according to an embodiment of the present disclosure.

As illustrated in FIG. 5, the circuit breaker 20 may include a voltage/current sensing unit 21 configured to detect a voltage shaped or current shaped analog signal of an arbitrary electric load, the RMS detector 10 configured to compute a RMS value based on an output voltage of the voltage/current sensing unit 21, and a comparator 22 configured to compare the RMS value computed (or output) from the RMS detector with a preset reference voltage to control the switching operation of the circuit breaker 20.

Here, according to the circuit breaker 20 illustrated in the drawing, a mechanism for performing a switching operation on an actual circuit, such as a well-known switching mechanism, typically contained in the circuit breaker will be contained in the circuit breaker 20 as a matter of course, but the illustration and description thereof will be omitted since it does not seem to be helpful in the understanding of the features of the present disclosure.

Figure 6:
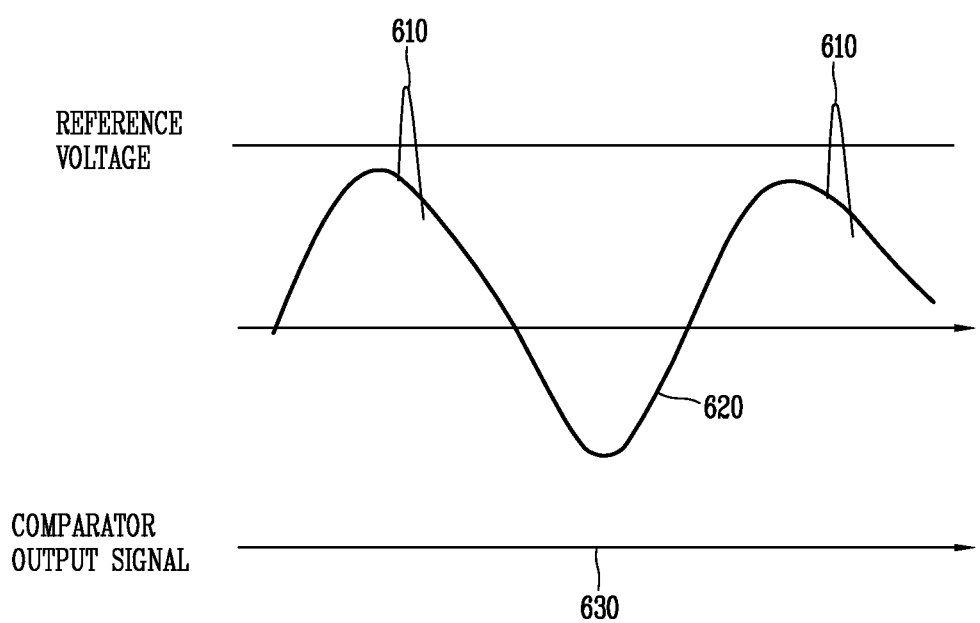
FIG. 6 is a waveform diagram a RMS average signal and a comparator output signal which are output values of the RMS detector contained in a circuit breaker according to an embodiment of the present disclosure.

Due to the foregoing configuration, as illustrated in FIG. 6, even when noise 610 is contained in a voltage or current sensing signal detected from the voltage/current sensing unit 21, a root mean square average value processing is primarily carried out by a RMS average signal 620 which is an output value of the RMS detector 10. Furthermore, noise 610 temporarily exceeding the preset reference voltage is secondarily detected by the comparator 22, and thus the resultant output signal 630 of the comparator 22 can be constantly output with no variation regardless of its temporary noise as illustrated in the drawing. Accordingly, a circuit breaker control output signal for controlling a switching mechanism of the circuit breaker to be operated to a circuit opening position may not be generated, thereby surely preventing a malfunction of the circuit breaker 20 being operated to an opening position due to noise.

Furthermore, a simple analog RMS detector 10 compared to a method of using a peak detector or level detector may be used, thereby allowing a fast detection with no delay due to its computational time.

A RMS detector according to an embodiment of the present disclosure may have a configuration in which a signal detected through the analog circuit is directly computed to measure a RMS value as described above, thereby easily and conveniently producing the RMS value.

Furthermore, in a RMS detector according to an embodiment of the present disclosure, the entire configuration of an analog circuit for producing the RMS value may be integrated into a circuit through a CMOS process or the like as described above, thereby minimizing the entire size with low cost.

Furthermore, a RMS detector according to an embodiment of the present disclosure has a configuration for producing the RMS value through an analog circuit, and thus a complicated process such as analog-digital conversion, computation and processing with the program and central processing unit or the like may be not carried out, thereby enhancing the circuit breaking speed when applied to application areas such as a circuit breaker that requires high-speed RMS value acquisition or the like.

Furthermore, a RMS detector and a circuit breaker having the relevant RMS detector according to an embodiment of the present disclosure may have a configuration for performing a root mean square calculation on a current or voltage in which an output value of the RMS circuit is compared with a reference value by a comparator to output the resultant output value, thereby preventing the reliability of a current or voltage detection value that can be contained in the detected current or voltage signal from being deteriorated as well as the relevant circuit breaker from being malfunctioned.

It will be apparent to those skilled in this art that various changes and modifications may be made thereto without departing from the gist of the present invention. Accordingly, it should be noted that the embodiments disclosed in the present invention are only illustrative and not limitative to the concept of the present invention, and the scope of the concept of the invention is not limited by those embodiments. The scope protected by the present invention should be construed by the accompanying claims, and all the concept within the equivalent scope of the invention should be construed to be included in the scope of the right of the present invention.

What is claimed is:

1. A Root Means Square (RMS) detector, comprising:
a plurality of voltage/current sensing units configured to detect a current-shaped analog signal of an arbitrary electric load and to convert the detected current shaped analog signal into a voltage-shaped analog signal;

a plurality of square circuit units each configured to compute a square function based on a voltage output from one of the plurality of voltage/current sensing units;

a summing circuit unit configured to sum a plurality of voltages output from the plurality of square circuit units; and a root circuit unit configured to compute an RMS value based on a voltage output from the summing circuit unit, wherein each of the plurality of square circuit units comprises:

a square function unit configured to compute the square function;

a root function unit configured to compute a root function; and a differential circuit configured to subtract an output current of the root function unit from an output current of the square function unit.

2. The RMS detector of claim 1, wherein each square function unit comprises:

a first current source having one end connected to a current supply unit and the other end connected to a source of a first transistor;

a second current source having one end connected to the current supply unit and the other end connected to a source of a second transistor;

the first transistor having its source connected to the first current source, its gate connected to a voltage output terminal of a corresponding one of the plurality of voltage/current sensing units and its drain connected to an output current source;

the second transistor having its source connected to the second current source, its gate connected to the voltage output terminal of a corresponding one of the plurality of voltage/current sensing unit and its drain connected to the output current source; and the output current source having one end connected to each of the drain of the first transistor and the drain of the second transistor and the other end connected to a ground.

3. The RMS detector of claim 1, wherein each root function unit comprises:

a first current source having one end connected to a current supply unit and the other end connected to each of a source of a first transistor, a gate of a second transistor and a gate of a third transistor;

a second current source having one end connected to each of a gate of the first transistor and a drain of the second transistor and the other end connected to a ground;

a third current source having one end connected to a current supply unit and the other end connected to a source of the third transistor;

the first transistor having its source connected to each of the first current source, the gate of the second transistor and the gate of the third transistor, its gate connected to each of the second current source and the drain of the second transistor and its drain connected to the ground;

the second transistor having its source connected to the current supply unit, its gate connected to each of the first current source, the source of the first transistor and a gate of the third transistor and its drain connected to each of the gate of the first transistor and the second current source;

the third transistor having its source connected to the first current source, its gate connected to each of the first current source, the source of the first transistor and the gate of the second transistor and its drain connected to a source and a gate of a fourth transistor; and the fourth transistor having its source and its gate connected to the drain of the third transistor and its drain connected to the ground.

4. The RMS detector of claim 1, wherein:

the root circuit unit is further configured to compute the RMS value according to the following equation based on the voltage output from the summing circuit unit:

$$\sqrt{I_c(KV_{in1}^2+KV_{in2}^2+KV_{in3}^2+\ldots+KV_{inN}^2)};$$

$I_c$ is a constant current value supplied from a current supply unit;

K is a trans conductance parameter; and $V_{in1}^2$ through $V_{inN}^2$ are voltages output from the plurality of voltage/current sensing units.

5. A circuit breaker, comprising:

a voltage/current sensing unit configured to detect a voltage-shaped or current-shaped analog signal of an arbitrary electric load;

a Root Means Square (RMS) detector configured to compute an RMS value based on an output voltage of the voltage/current sensing unit; and a comparator configured to compare the computed RMS value with a preset reference voltage and to control a switching operation of the circuit breaker, wherein the RMS detector comprises:

a square circuit unit configured to compute a square function based on the output voltage of the voltage/current sensing unit;

a summing circuit unit configured to sum a plurality of voltages output from the square circuit unit; and a root circuit unit configured to compute an RMS value based on a voltage output from the summing circuit unit, and wherein the square circuit unit comprises:

a square function unit configured to compute the square function;

a root function unit configured to compute a root function; and a differential circuit configured to subtract an output current of the root function unit from an output current of the square function unit.

6. The circuit breaker of claim 5, wherein the RMS detector is further configured to suppress noise contained in the output voltage of the voltage/current sensing unit.

7. The circuit breaker of claim 5, wherein the square function unit comprises:

a first current source having one end connected to a current supply unit and the other end connected to a source of a first transistor;

a second current source having one end connected to the current supply unit and the other end connected to a source of a second transistor;

the first transistor having its source connected to the first current source, its gate connected to a voltage output terminal of the voltage/current sensing unit and its drain connected to an output current source;

the second transistor having its source connected to the second current source, its gate connected to the voltage output terminal of the voltage/current sensing unit and its drain connected to the output current source; and the output current source having one end connected to each of the drain of the first transistor and the drain of the second transistor and the other end connected to a ground.

8. The circuit breaker of claim 5, wherein the root function unit comprises:
- a first current source having one end connected to a current supply unit and the other end connected to each of a source of a first transistor, a gate of a second transistor and a gate of a third transistor;
- a second current source having one end connected to each of a gate of the third transistor and a drain of the second transistor and the other end connected to a ground;
- a third current source having one end connected to the current supply unit and the other end connected to a source of the third transistor;
- the first transistor having its source connected to each of the first current source, the gate of the second transistor and the gate of the third transistor, its gate connected to the each of second current source and the drain of the second transistor and its drain connected to the ground;
- the second transistor having its source connected to the current supply unit, its gate connected to each of the first current source, the source the first transistor and a gate of the third transistor and its drain connected each of the gate of the first transistor and the second current source;
- the third transistor having its source connected to the first current source, its gate connected to each of the first current source, the source of the first transistor and the gate of the second transistor and its drain connected to a source and a gate of a fourth transistor; and
- the fourth transistor having its source and its gate connected to the drain of the third transistor and its drain connected to the ground.

9. The circuit breaker of claim 5, wherein the root circuit unit is further configured to compute the RMS value according to the following equation based on the voltage output from the summing circuit unit:

$$\sqrt{I_c(KV_{in1}^2+KV_{in2}^2+KV_{in3}^2+\ldots+KV_{inN}^2)};$$

$I_c$ is a constant current value supplied from a current supply unit;

K is a trans conductance parameter; and $V_{in1}^2$ through $V_{inN}^2$ are voltages output from the plurality of voltage/current sensing units.

* * * * *